(12) United States Patent
Yamazaki et al.

(10) Patent No.: US 6,180,439 B1
(45) Date of Patent: *Jan. 30, 2001

(54) METHOD FOR FABRICATING A SEMICONDUCTOR DEVICE

(75) Inventors: Shunpei Yamazaki, Tokyo; Satoshi Teramoto, Kanagawa; Jun Koyama, Kanagawa; Yasushi Ogata, Kanagawa; Masahiko Hayakawa, Kanagawa; Mitsuaki Osame, Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/784,290

(22) Filed: Jan. 16, 1997

(30) Foreign Application Priority Data

Jan. 26, 1996 (JP) .................................... 8-032874

(51) Int. Cl.[7] .................... H01L 21/84; H01L 21/322; H01L 21/20

(52) U.S. Cl. .................... 438/162; 438/166; 438/475; 438/476; 438/487

(58) Field of Search ................. 438/486, 487, 438/166, 162, 476, FOR 146, 471, 475

(56) References Cited

U.S. PATENT DOCUMENTS

| | | |
|---|---|---|
| Re. 28,385 | 4/1975 | Mayer . |
| Re. 28,386 | 4/1975 | Heiman et al. . |
| Re. 36,314 * | 9/1999 | Yamazaki et al. .................... 257/57 |
| 3,783,049 | 1/1974 | Sandera . |
| 4,059,461 | 11/1977 | Fan et al. . |
| 4,086,020 | 4/1978 | Reuschel . |
| 4,132,571 | 1/1979 | Cuomo et al. . |
| 4,174,217 | 11/1979 | Flatley . |
| 4,226,898 | 10/1980 | Ovshinsky et al. . |
| 4,231,809 | 11/1980 | Schmidt . |
| 4,271,422 | 6/1981 | Ipri . |
| 4,277,884 | 7/1981 | Hsu . |
| 4,300,989 | 11/1981 | Chang . |
| 4,309,224 | 1/1982 | Shibata . |
| 4,331,709 | 5/1982 | Risch et al. . |

(List continued on next page.)

FOREIGN PATENT DOCUMENTS

| | | |
|---|---|---|
| 0178447 | 9/1984 | (EP) . |
| 6-0105216 | 10/1985 | (JP) . |
| 61-63107 | 4/1986 | (JP) . |

(List continued on next page.)

OTHER PUBLICATIONS

Wolf et al., Silicon Processing for the VLSI era, V1, pp. 550–551, 1986.*

(List continued on next page.)

Primary Examiner—Brian Dutton
(74) Attorney, Agent, or Firm—Nixon Peabody LLP; Eric J. Robinson

(57) ABSTRACT

Concentration of metal element which promotes crystallization of silicon and which exists within a crystalline silicon film obtained by utilizing the metal element is reduced. A first heat treatment for crystallization is performed after introducing nickel to an amorphous silicon film 103. Then, laser light is irradiated to diffuse nickel element which is concentrated locally. After that, another heat treatment is performed within an oxidizing atmosphere at a temperature higher than that of the previous heat treatment. At this time, HCl or the like is added to the atmosphere. A thermal oxide film 106 is formed in this step. At this time, gettering of the nickel element into the thermal oxide film 106 takes place. Then, the thermal oxide film 106 is removed. Thereby, a crystalline silicon film 107 having low concentration of the metal element and a high crystallinity can be obtained.

38 Claims, 7 Drawing Sheets

U.S. PATENT DOCUMENTS

| | | |
|---|---|---|
| 4,379,020 | 4/1983 | Glaeser et al. . |
| 4,409,724 | 10/1983 | Tasch, Jr. et al. . |
| 4,534,820 | 8/1985 | Mori et al. . |
| 4,544,418 | 10/1985 | Gibbons . |
| 4,546,376 * | 10/1985 | Nakata et al. ...................... 357/23.7 |
| 4,597,160 * | 7/1986 | Ipri ......................................... 29/571 |
| 4,634,473 | 1/1987 | Swartz et al. . |
| 4,755,481 | 7/1988 | Faraone . |
| 4,959,247 | 9/1990 | Moser et al. . |
| 4,996,077 * | 2/1991 | Moslehi et al. . |
| 5,043,224 | 8/1991 | Jaccodine et al. . |
| 5,075,259 | 12/1991 | Moran . |
| 5,112,764 | 5/1992 | Mitra et al. . |
| 5,145,808 | 9/1992 | Sameshima et al. . |
| 5,147,826 | 9/1992 | Liu et al. . |
| 5,173,446 | 12/1992 | Asakawa et al. . |
| 5,200,630 | 4/1993 | Nakamura et al. . |
| 5,221,423 | 6/1993 | Sugino et al. . |
| 5,225,355 | 7/1993 | Sugino et al. . |
| 5,244,836 | 9/1993 | Lim . |
| 5,254,480 | 10/1993 | Tran . |
| 5,262,350 | 11/1993 | Yamazaki et al. . |
| 5,262,654 | 11/1993 | Yamazaki . |
| 5,275,851 | 1/1994 | Fonash et al. . |
| 5,278,093 | 1/1994 | Yonehara . |
| 5,289,030 | 2/1994 | Yamazaki . |
| 5,296,405 | 3/1994 | Yamazaki et al. . |
| 5,298,075 | 3/1994 | Lagendijk et al. . |
| 5,308,998 | 5/1994 | Yamazaki et al. . |
| 5,313,075 | 5/1994 | Zhang et al. . |
| 5,352,291 | 10/1994 | Zhang et al. . |
| 5,358,907 | 10/1994 | Wong . |
| 5,366,926 | 11/1994 | Mei et al. . |
| 5,403,772 | 4/1995 | Zhang et al. . |
| 5,424,230 | 6/1995 | Wakai . |
| 5,426,064 | 6/1995 | Zhang et al. . |
| 5,480,811 | 1/1996 | Chiang et al. . |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,504,019 * | 4/1996 | Miyasaka et al. ..................... 437/40 |
| 5,508,533 | 4/1996 | Takemura . |
| 5,529,937 | 6/1996 | Zhang et al. . |
| 5,531,182 | 7/1996 | Yonehara . |
| 5,534,716 | 7/1996 | Takemura . |
| 5,543,352 | 8/1996 | Ohtani et al. . |
| 5,550,070 * | 8/1996 | Funai et al. ............................ 437/41 |
| 5,563,426 | 10/1996 | Zhang et al. . |
| 5,569,610 | 10/1996 | Zhang et al. . |
| 5,569,936 | 10/1996 | Zhang et al. . |
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 * | 6/1997 | Yamazaki ............................. 437/228 |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,677,549 | 10/1997 | Takayama et al. . |
| 5,696,386 | 12/1997 | Yamazaki . |
| 5,696,388 | 12/1997 | Funada et al. . |
| 5,700,333 | 12/1997 | Yamazaki et al. . |
| 5,705,829 | 1/1998 | Miyanaga et al. . |
| 5,712,191 | 1/1998 | Nakajima et al. . |
| 5,744,822 | 4/1998 | Takayama et al. ..................... 257/66 |
| 5,744,824 | 4/1998 | Kousai et al. ......................... 257/74 |
| 5,756,364 | 5/1998 | Tanaka et al. . |
| 5,766,977 | 6/1998 | Yamazaki ............................. 438/151 |
| 5,773,327 | 6/1998 | Yamazaki et al. ................... 438/154 |
| 5,773,846 | 6/1998 | Zhang et al. ............................ 257/66 |
| 5,773,847 | 6/1998 | Hayakawa ............................. 257/66 |
| 5,795,795 | 8/1998 | Kousai et al. ........................ 437/174 |
| 5,808,321 | 9/1998 | Mitanaga et al. ...................... 257/72 |
| 5,811,327 | 9/1998 | Funai et al. .......................... 438/166 |
| 5,818,076 | 10/1998 | Zhang et al. . |
| 5,821,138 | 10/1998 | Yamazaki et al. ................... 438/166 |
| 5,824,574 | 10/1998 | Yamazaki et al. ................... 438/150 |
| 5,888,858 * | 3/1999 | Yamazaki et al. ................... 438/162 |
| 5,956,579 * | 9/1999 | Yamazaki et al. ................... 438/151 |
| 5,961,743 * | 10/1999 | Yamazaki et al. ................... 136/258 |
| 5,985,740 * | 11/1999 | Yamazaki et al. ................... 438/486 |

FOREIGN PATENT DOCUMENTS

| | | |
|---|---|---|
| 1187814 | 2/1989 | (JP) . |
| 1-187874 | 7/1989 | (JP) . |
| 1-187875 | 7/1989 | (JP) . |
| 1-206632 | 8/1989 | (JP) . |
| 2-140915 | 5/1990 | (JP) . |
| 2-275641 | 9/1990 | (JP) . |
| 3-280418 | 11/1991 | (JP) . |
| 3-280420 | 12/1991 | (JP) . |
| 5-82442 | 4/1993 | (JP) . |
| 52-99348 | 11/1993 | (JP) . |
| 7-16134 | 6/1995 | (JP) . |

OTHER PUBLICATIONS

Kawazu, Japanese Journal of Applied Physics:vol. 29 No. 12 Dec. 1990 pp.:2698–2704 "Low–Temperature Crystallization of Hydrogenated Amorphous Silicon Induced by Nickel Silicide Formation".*

Kawazu, Japanese journal of Applied Physics:vol. 29 No. 4 Apr. 1990 pp.:729–738 "Initial Stage of the Interfacial Reaction between Nickel and Hydrogenated Amorphous Silicon".*

Fumiya OKI et al., "Effect of Deposited Metals on the Crystallization Temperature of Amorphous Germanium Film", Japan J. Appl. Phys. 8 (1969) pp 1056.*

R. J. Nemanich et al, "Structure and Growth of the Interface of Pd on α–SiH", The American Physical Society—Physical Review, vol. 22, No. 12, pp. 6828–6831, Jun. 1981.*

M.J. Thompson et al, "Silicide Formation in a Pd–α–Si:H Schottky Barriers", Appl. Phys. Lett., vol. 39, No. 3, pp. 274–276, Aug. 1981.*

R.J. Nemanich et al, "Initial Phase Formation at the Interface of Ni, Pd, or Pt and Si", Mat. Res. Soc. Symp. Proc., vol. 25, 1984.*

S. Lau et al., "Solid Phase Epitaxy in Silicide Forming System", Thin Solid Films, 47 (1977) pp. 313–322.*

I.W. Boyd et al., "Oxidation of Silicon Surfaces by $CO_2$ Lasers", Applied Physics Letters, vol. 41, No. 2, Jul. 15, 1962, pp. 162–164.*

S. K. Ghandi, VLSI Fabrication Principles, John Wiley & Sons, 1983, pp. 419–429.*

P.Zorabedian et al., "Lateral Seeding of Silicon–on–Insu".*

T. Hempel et al., "Needle–Like Crystallization of Ni Doped Amorphous Silicon Thin Films", Solid State Communications, vol. 85, No. 11, pp. 921–924, (1993).*

A.V. Dvurechenskii et al., "Transport Phenomena in Amorphous Silicon Doped by Ion Implantation of 3d Metals", Akademikian Lavrentev Prospekt 13, 630090 Novosibirsk 90, USSR, pp. 635–640, Phys. Stat, Sol. (1986).*

Kawazu et al., "Low Temperature Crystallization of Hydrogenated Amorphous Silicon Induced by Nickel Silicide Formation", Institute of Applied Physics, vol. 29, No. 12, pp. 2698–2704, Dec. 1990.*

Wolf et al., "Silicon Processing for the VLSI Era vol. 1: Process Technology", Lattice Press 1986, pp. 215–216.*

R. Kakkad et al., "Crystallized Si Films by Low–Temperature Rapid Thermal Annealing of Amorphous Silicon," J. Appl. Phys., 65(5), Mar. 1, 1989, pp. 2069–2072.*

G. Liu et al., "Polycrystalline Silicon Thin Film Transistors on Corning 7059 Glass Substrates Using Short Time, Low–Temperature Processing," Appl. Phys. Lett. 62(20), May 17, 1993, pp. 2554–2556.*

G. Liu et al. "Selective Area Crystallization of Amorphous Silicon Films by Low–Temperature Rapid Thermal Annealing", Appl. Phys. Lett 55(7), Aug. 14, 1989, pp. 660–662.*

R. Kakkad et al., "Low Temperature Selective Crystallization of Amorphous Silicon", Journal of Non–Crystalline Solids, 115, 1989, pp.66–68.*

F. Oki et al., Jpn. J. Appl. Phys., 8 (1969) 1056 "Effect of Deposited Metals on the Crystallization Temperature . . . ".*

T.B. Suresh et al., Thin Solid Films, 252 (1994) 78 "Electroless Plated Ni Contacts to Hyrogenated Amorphous Silicon", Dec. 1994.*

F. Spaepen et al., Crucial Issued in Semiconductor Materials & Processing Technologies, "Metal–Enhanced Growth in Silicon", (1992) 483–99, Nov. 1992.*

Wolf et al., "Silicon Processing for the VLSI Era", vol. 1, pp. 207–211, 1986.*

Hatalis et al. "High Performance TFTs in Low Temperature Crystallized LPCVD Amorphous Silicon Films", Elec. Dev. Letters vol. EDL 8, No. 8, Aug., 1987.*

S. Takenaka et al., Jpn. J. Appl. Phys. vol. 29, No. 12, Dec. 12, 1990; pp. L2380–2383, "High Mobility Poly–Si Thin Film Transistors Using Solid Phase Crystallize a—Si Films Deposited by Plasma Enhanced Chemical Vapor Deposition".*

J.M. Green et al., IBM Tech. Discl. Bulletin, vol. 16 No. 5, Oct. 1973, pp. 1612–1613 "Method to Purify Semiconductor Wafers".*

C. Hayzelden et al., J. Appl. Phys., 73, 12; Jun. 15, 1993; pp. 8279–8289, "Silicide Formation and Silicide Medicated Crystallization of Nickel–Implanted Amorphous Silicon Thin Films".*

A.Y. Kuznetsov et al., Inst. Phys. Conf. Ser. #134.4; proceedings of Royal Microscopical Society Conf.; Apr. 5–8, 1993; p. 191–194; "Silicide Precipitate Formation and Solid Phase Regrowth of Ni–implanted Amorphous Silicon".*

Y.N. Erokhin et al., Appl. Phys. Lett., 63, 23; Dec. 6, 1993; pp. 3173–3175; "Spatially Confined $NiSi_2$ Formation at 400° C on Ion Implantation Preamorphized Silicon".*

J. Stoemnos et al.; Appl. Phys. Lett., 58, 11; Mar. 18, 1991; pp. 1196–1198; "Crystallization of Amorphous Silicon by Reconstructive Transformation Utilizing Gold".*

J.L. Batstone et al., Solid State Phenomena, vols. 37–38 (1994); "Microscopic Processes iun Crystallization".*

A.Y. Kuznetsov et al., Nucl. Instruments Methods Physics Research, 880/81 (1993), pp. 990–993, "Enhanced Solid Phase Epitaxial Recrystallization of Amorphous Silicon Due to Nickel Silicide Precipitation Resuling from Ion Implantation and Annealing".*

R.C. Cammarata et al., J. Mater. Res., vol. 5, No. 10; Oct. 10, 1990; pp.2133–2138; "Silicide Precipitation and Silicon Crystallization in Nickel Implanted Amphorous Silicon Thin Films".*

A. Y. Kuznetsov et al., Inst. Phys. Conf. Ser. #134.4; Proceedings of Royal Microscopical Society Conf.; Apr. 5–8, 1993; p. 191–194; "Silicone Precipitate Formation and Solid Phase Regrowth of Ni–implanted Amorphous Silicon".*

J.J.P. Bruines et al., Appl. Phys. Lett, 50, 9 (1987) 507, "Between explosive crystallization and amorphous strength regrowth: Inhomogeneous solidification upon pulsed Laser Annealing of amorphous silicon".*

S. Caune et al., App. Surf. Sci., 36 (1989) 597, "Combined CW Laser and Furnace Annealing of a Si and Ge in Contact With Some Metals".*

* cited by examiner

IRRADIATION OF LASER LIGHT

METHOD FOR FABRICATING A SEMICONDUCTOR DEVICE

FIELD OF THE INVENTION

The present invention relates to a semiconductor device typified by a thin film transistor and to a fabrication method thereof. Specifically, the present invention relates to a semiconductor device using a crystalline silicon thin film formed on a glass substrate or a quartz substrate and to a fabrication method thereof.

DESCRIPTION OF RELATED ART

Hitherto, there has been known a thin film transistor using a silicon film, i.e. a technology for forming the thin film transistor by using the silicon film formed on a glass substrate or quartz substrate.

The glass substrate or quartz substrate is used because the thin film transistor is used for an active matrix type liquid crystal display. While a thin film transistor has been formed by using an amorphous silicon film in the past, it is being tried to fabricate the thin film transistor by utilizing a silicon film having a crystallinity (referred to as "crystalline silicon film" hereinbelow) in order to enhance its performance.

The thin film transistor using the crystalline silicon film can operate at high speed by more than two digits as compared to one using an amorphous silicon film. Therefore, while peripheral driver circuits of an active matrix liquid crystal display have been composed of external IC circuits, they may be built on the glass substrate or quartz substrate similarly to the active matrix circuit.

Such structure is very advantageous in miniaturizing the whole apparatus and in simplifying the fabrication process, thus leading to reduction of the fabrication cost.

In general, a crystalline silicon film has been obtained by forming an amorphous silicon film by means of plasma CVD or low pressure thermal CVD and then by crystallizing it by performing a heat treatment or by irradiating laser light.

However, it has been difficult to obtain a required crystallinity across the wide area through the heat treatment because it may cause nonuniformity in the crystallization.

Further, although it is possible to obtain the high crystallinity partly by irradiating laser light, it is difficult to obtain a good annealing effect across the wide area. In particular, the irradiation of the laser light is apt to become unstable under the conditions needed for obtaining the good crystallinity.

Meanwhile, a technology described in Japanese Patent Laid-Open No. Hei. 6-232059 has been known. This technology obtains a crystalline silicon film through a heat treatment at a lower temperature than that of the prior art by introducing a metal element (e.g. nickel) which promotes the crystallization of silicon to the amorphous silicon film.

This technology allows high crystallinity to be obtained uniformly across a wide area as compared to the prior art crystallization method by way of only heating or crystallization of an amorphous silicon film only by means of irradiation of laser light.

However, it is difficult to obtain a crystalline silicon film having high crystallinity and homogeneity across a wide area which is required for an active matrix type liquid crystal display.

Further, because the metal element is contained within the film and an amount thereof to be introduced has to be controlled very carefully, there is a problem in its reproducibility and stability (electrical stability of a device obtained).

Still more, there is a problem that an elapsed change of the characteristics of a semiconductor device to be obtained is large or an OFF value, in case of a thin film transistor, is large, due to the influence of the remaining metal element.

That is, although the metal element which promotes the crystallization of silicon plays the useful role in obtaining the crystalline silicon film, its existence becomes a negative factor which causes various problems after obtaining the crystalline silicon film once.

SUMMARY OF THE INVENTION

It is an object of the invention disclosed in the present specification to provide a semiconductor device having excellent characteristics by using a crystalline silicon film having a high crystallinity.

It is an object of the invention disclosed in the present specification to provide a technology for reducing concentration of a metal element within a crystalline silicon film obtained by utilizing the metal element which promotes crystallization of silicon.

It is another object of the present invention to provide a technology which can enhance characteristics and reliability of the semiconductor device thus obtained.

One of the inventions disclosed in the present specification is characterized in that it comprises steps of intentionally introducing a metal element which promotes crystallization of silicon to an amorphous silicon film and crystallizing the amorphous silicon film by a first heat treatment to obtain a crystalline silicon film; irradiating laser light or intense light to the crystalline silicon film; removing or reducing the metal element existing within the crystalline silicon film by performing a second heat treatment within an oxidizing atmosphere containing a halogen element; removing a thermal oxide film formed in the previous step; and forming another thermal oxide film on the surface of the region from which the thermal oxide film has been removed by performing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystalline silicon film; irradiating laser light or intense light to the crystalline silicon film to diffuse the metal element, existing within the crystalline silicon film, in the crystalline silicon film; performing a second heat treatment within an oxidizing atmosphere containing a halogen element to cause the metal element existing within the crystalline silicon film to be gettered to a thermal oxide film to be formed; removing the thermal oxide film formed in the previous step; and forming another thermal oxide film on the surface of the region from which the thermal oxide film has been removed by performing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystalline silicon film; forming an active layer of the semiconductor device by patterning the crystalline silicon film; irradiating laser light or intense light to the active layer; performing a second heat treatment within an oxidizing atmosphere containing a halogen element to remove or reduce the metal element existing within the active layer; removing a thermal oxide film formed in the previous step; and forming another thermal oxide film on the surface of the active layer by performing another thermal oxidation.

An arrangement of another invention is characterized in that it comprises steps of intentionally and selectively introducing a metal element which promotes crystallization of silicon to an amorphous silicon film; performing a first heat treatment to the amorphous silicon film to grow crystal in a direction parallel to the film from a region of the amorphous silicon film into which the metal element has been intentionally and selectively introduced; irradiating laser light or intense light to diffuse the metal element existing within the region where the crystal has grown; performing a second heat treatment within an oxidizing atmosphere containing a halogen element to cause the metal element existing within the region where the crystal has grown to be gettered to a thermal oxide film to be formed; removing the thermal oxide film formed in the previous step; and forming another thermal oxide film on the surface of the region from which the thermal oxide film has been removed by performing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystalline silicon film; forming an active layer of the semiconductor device by patterning the crystalline silicon film; irradiating laser light or intense light to the active layer; performing a second heat treatment within an oxidizing atmosphere containing a halogen element to remove or reduce the metal element existing within the active layer; removing a thermal oxide film formed in the previous step; and forming another thermal oxide film on the surface of the active layer by performing another thermal oxidation, wherein the active layer has a tapered shape in which an angle formed between a side face and an underlying face is 20° to 50°.

In the invention disclosed in the present specification, one or a plurality elements selected from Fe, Co, Ni, Ru, Rh, Pd, Os, Ir, Pt, Cu and Au may be used as the metal element which promotes the crystallization of silicon.

Further, as the oxidizing atmosphere containing the halogen element, an atmosphere to which one or a plurality of gases selected from HCl, HF, HBr, $Cl_2$, $F_2$ or $Br_2$ is added into an $O_2$ atmosphere or an atmosphere containing $O_2$ may be used.

The concentration of impurity in the present specification is defined as the minimum value of measured values measured by the SIMS (secondary ion mass spectrometry).

According to a preferred mode for carrying out the invention disclosed in the present specification, an amorphous silicon film is formed at first. Then, the amorphous silicon film is crystallized by an action of metal element typified by nickel which promotes crystallization of silicon to obtain a crystalline silicon film. The crystallization is carried out by heat treatment.

This heat treatment is performed within a range of 550° C. to 750° C. It is preferable to perform the heat treatment at a temperature above 620° C.

The metal element is contained in the crystalline silicon film in the state in which the film has been crystallized by the above-mentioned heat treatment.

Here, laser light is irradiated to promote the crystallization of the crystalline silicon film obtained and to diffuse (disperse) the nickel element existing within the film further within the film at the same time.

In the state in which the film is crystallized by the first heat treatment, the nickel element exists as certain blocks. Then, the nickel element may be diffused by a certain degree so that it may be readily gettered later by irradiating the laser light described above.

After irradiating the laser light, another heat treatment is performed within an oxidizing atmosphere to which HCl is added to form a thermal oxide film on the surface of the crystalline silicon film.

At this time, the metal element is gettered to the thermal oxide film by the action of chlorine and the concentration of the metal element within the crystalline silicon film is reduced. Further, the nickel element is gasified and removed to the outside by the action of chlorine.

The heat treatment for gettering the nickel element is preferable to perform at a temperature higher than that of the heat treatment for the crystallization. It is preferable to perform the heat treatment at a temperature over 600° C., or more preferably at 640° C. or more. The upper limit thereof may be adequately set as temperature below 750° C.

As a result of the heat treatment for gettering, a thermal oxide film containing the nickel element in high concentration is formed. Then, the crystalline silicon film having the high crystallinity and having low concentration of the metal element may be obtained by removing this thermal oxide film.

The use of the invention disclosed in the present specification allows to provide the technology for reducing the concentration of metal element within the crystalline silicon film which has been obtained by utilizing the metal element which promotes the crystallization of silicon. The use of this technology also allows a more reliable and higher performance thin film semiconductor device to be obtained.

DETAILED DESCRIPTION OF PREFERRED EMBODIMENTS

FIRST EMBODIMENT

Figure 1A:
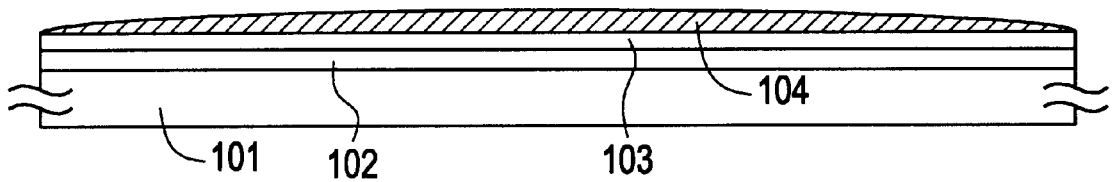
FIGS. 1A–1E shows steps for obtaining a crystalline silicon film.

An arrangement for obtaining a crystalline silicon film on a glass substrate by utilizing nickel element will be explained in the present embodiment.

At first, the crystalline silicon film having a high crystallinity is obtained by an action of nickel element in the present embodiment.

Then, laser light is irradiated to enhance the crystallinity of the film and to diffuse nickel element existing locally concentrated within the film. That is, the block of nickel is extinguished.

Next, a thermal oxide film containing a halogen element is formed on the crystalline silicon film by thermal oxidation. At this time, the nickel element remaining in the crystalline silicon film thus obtained is gettered to the thermal oxide film by an action of the halogen element. Because the nickel element is distributed by the irradiation of the laser light, the gettering proceeds effectively.

Then, the thermal oxide film containing the nickel element in high concentration as a result of the gettering is removed. Thereby, the crystalline silicon film having nickel element in low concentration while having the high crystallinity is obtained on the glass substrate.

A fabrication process of the present embodiment will be explained by using FIG. 1. At first, a silicon oxide nitride film 102 is formed as an underlying film in a thickness of 3000 angstrom on the glass substrate 101 of Corning 1737 (distortion point: 667° C.).

The silicon oxide nitride film is formed by using plasma CVD using sillane, $N_2O$ gas and oxygen as original gases. Or, it may be formed by using plasma CVD using TEOS gas and $N_2O$ gas.

The silicon oxide nitride film has a function of suppressing the diffusion of impurities from the glass substrate in the later steps (seeing from the level of fabrication of a semiconductor, a glass substrate contains a large amount of impurities).

It is noted that the silicon nitride film is most suitable to maximize the function of suppressing the diffusion of the impurities. However, the silicon nitride film is not practical because it may be peeled off from the glass substrate due to the influence of stress. A silicon oxide film may be also used as the underlying film instead of the silicon oxide nitride film.

It is also important to increase the hardness of the underlying film 102 as much as possible. It is concluded from the fact that the harder the hardness of the underlying film (i.e. the smaller the etching rate thereof), the higher the reliability is in an endurance test of the thin film transistor obtained finally. It is assumed to be caused by the effect of blocking the impurities from the glass substrate in the fabrication process of the thin film transistor.

It is also effective to include a small amount of halogen element typified by chlorine in the underlying film 102. Thereby, the metal element which promotes crystallization of silicon and which exists within the semiconductor layer may be gettered by the halogen element in the later step.

It is also effective to perform a hydrogen plasma treatment after forming the underlying film. It is also effective to perform a plasma treatment in an atmosphere in which oxygen and hydrogen are mixed. These treatments are effective in removing carbon component which is adsorbed on the surface of the underlying film and in enhancing the interfacial characteristic with a semiconductor film formed later.

Next, an amorphous silicon film 103, which turns out to be a crystalline silicon film later, is formed in a thickness of 500 angstrom by low pressure thermal CVD. The reason why low pressure thermal CVD is used is because the quality of the crystalline silicon film obtained later is better, i.e. the film quality is denser. Besides the low pressure thermal CVD, the plasma CVD may be used.

The amorphous silicon film fabricated here is desirable to have $5\times10^{17}$ cm$^{-3}$ to $2\times10^{19}$ cm$^{-3}$ of concentration of oxygen within the film. It is because oxygen plays an important role in the later step of gettering the metal element (which promotes crystallization of silicon).

However, it must be careful here because the crystallization of the amorphous silicon film is hampered if the oxygen concentration is higher than the above-mentioned range of concentration.

The concentration of other impurities such as those of nitrogen and carbon is preferred to be as low as possible. In specifically, the concentration must be below $2\times10^{19}$ cm$^{-3}$.

The upper limit of the thickness of the amorphous silicon film is about 2000 angstrom. It is because it is disadvantageous to have a thick film to obtain the effect of laser irradiated later. Thick film is disadvantageous because the laser light irradiated to the silicon film is absorbed almost completely at the surface of the film.

The lower limit of the amorphous silicon film 103 is practically about 200 angstrom, though it depends on how it is formed.

Next, nickel element is introduced to the amorphous silicon film 103 to crystallize it. Here, the nickel element is introduced by applying nickel acetate solution containing 10 ppm (to weight) of nickel on the surface of the amorphous silicon film 103.

Besides the method of using the above-mentioned solution, sputtering, CVD, plasma treatment or adsorption may be used as the method for introducing the nickel element.

The method of using the solution is useful in that it is simple and that the concentration of the metal element may be readily adjusted.

The nickel acetate solution is applied as described above to form a liquid film 104 as shown in FIG. 1A. After obtaining this state, extra solution is blown out by using a spin coater not shown. Thus, the nickel element is held in contact on the surface of the amorphous silicon film 103.

It is noted that it is preferable to use nickel sulfate solution, instead of using the nickel acetate, if the remained impurities in the later heating process is taken into consideration. It is because the nickel acetate contains carbon and it might be carbonized in the later heating process, thus remaining within the film.

An amount of the nickel element to be introduced may be controlled by adjusting the concentration of nickel element within the solution.

Figure 1B:
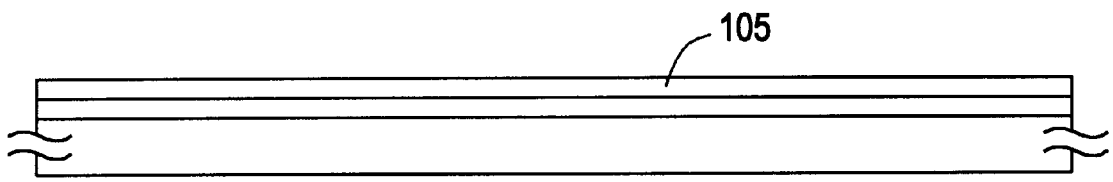

Next, a heat treatment is performed in the temperature range from 550° C. to 650° C. in the state shown in FIG. 1B to crystallize the amorphous silicon film 103 and to obtain a crystalline silicon film 105. This heat treatment is performed in a reducing atmosphere.

It is preferable to perform the heat treatment below the temperature of the distortion point of the glass substrate. Because the distortion point of the Corning 1737 glass substrate is 667° C., the upper limit of the heating temperature here is preferable to be about 650° C., leaving some margin.

Here, the heat treatment is performed for four hours at 620° C. within a nitrogen atmosphere containing 3% of hydrogen.

The reason why the reducing atmosphere is adopted in the crystallization step by way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step carried out by way of heating.

The concentration of oxygen within the atmosphere for performing the heat treatment for the crystallization has to be in an order of ppm, or preferably, less than 1 ppm.

Inert gases such as argon, besides nitrogen, may be used as the gas which occupies the most of the atmosphere for performing the heat treatment for the crystallization.

After the crystallization step by way of the heat treatment, nickel element remains as blocks. This fact has been confirmed from the observation by means of TEM (transmission electron microscope).

Although the cause of the fact that the nickel exists as blocks is not clear yet, it is considered to be related with some crystallization mechanism.

Figure 1C:
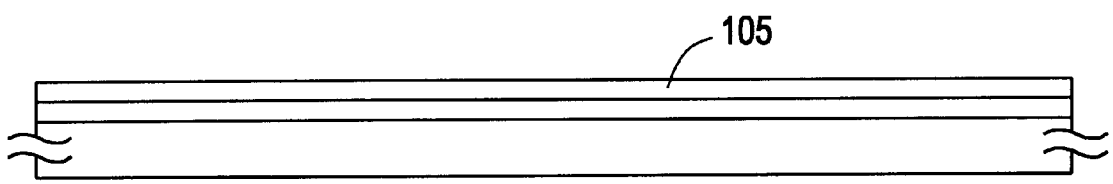

Next, laser light is irradiated as shown in FIG. 1C. Here, KrF excimer laser (wavelength: 248 nm) is used. Here, a method of irradiating the laser light by scanning its linear beam is adopted.

The nickel element which has been locally concentrated as a result of the crystallization carried out by way of the aforementioned heat treatment is distributed by a certain degree within the film 105 by irradiating the laser light. That is, the nickel element may be distributed by disappearing the blocks of the nickel element.

Figure 1D:
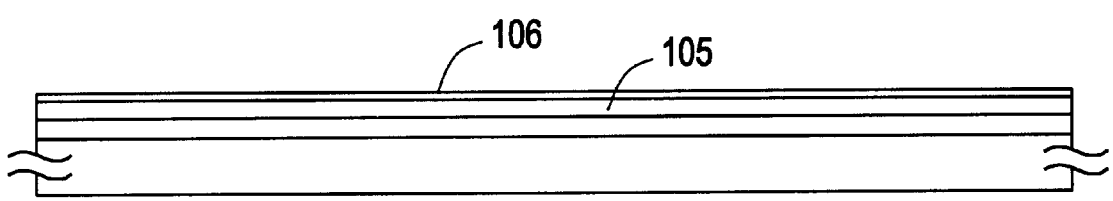

Another heat treatment is performed in the step shown in FIG. 1D to form a thermal oxide film for gettering the nickel element. Here, this heat treatment is performed within an atmosphere containing halogen element. Specifically, the heat treatment is carried out in an oxygen atmosphere containing 5% of HCl (FIG. 1D).

This step is carried out to remove the nickel element (or another element which promotes crystallization of silicon) which has been introduced intentionally for the crystallization in the initial stage from the crystalline silicon film 105. This heat treatment is performed at a temperature higher than that of the heat treatment performed for the crystallization described above. It is an important condition for effectively performing the gettering of nickel element.

This heat treatment is performed in the temperature range from 600° C. to 750° C. upon meeting the above-mentioned condition. The effect of gettering the nickel element in this step may be obtained remarkably when the temperature is higher than 600° C.

In this step, the nickel element which has been distributed by the above-mentioned irradiation of laser is effectively gettered to the oxide film.

Further, the upper limit of the heating temperature is limited by the distortion point of the glass substrate to be used. It must be careful not to perform the heat treatment in a temperature above the distortion point of the glass substrate to be used because it is deformed.

It is preferable to mix HCl with a ratio of 0.5% to 10% (volume %) of oxygen. It must be careful not to mix it above this concentration because, otherwise, the surface of the film is roughened with the same degree of irregularity with the thickness of the film.

By performing the heat treatment under such conditions, the thermal oxide film 106 containing chlorine as shown in FIG. 1D is formed. Here, the heat treatment is performed for 12 hours and the thickness of the thermal oxide film 106 is 100 angstrom.

Because the thermal oxide film 106 is formed, the thickness of the crystalline silicon film 103 becomes about 450 angstrom.

When the heating temperature is 600° C. to 750° C. in this heat treatment, the treatment time (heating time) is set at 10 hours to 48 hours, typically at 24 hours.

This treatment time may be set adequately depending on the thickness of the oxide film to be obtained as a matter of course.

In this step, nickel element is gettered out of the silicon film by the action of the halogen element. Here, the nickel element is gettered to the thermal oxide film 106 formed by the action of chlorine.

In the gettering, oxygen existing within the crystalline silicon film plays an important role. That is, the gettering of the nickel element proceeds effectively by chlorine acting on nickel oxide formed when oxygen couples with nickel.

If the concentration of oxygen is too much, it becomes the factor of hampering the crystallization of the amorphous silicon film 103 in the crystallization step shown in FIG. 1B as described above. However, the existence thereof plays an important role in the process of gettering nickel as described above. Accordingly, it is important to control the concentration of oxygen existing within the amorphous silicon film as a starting film.

Here, Cl has been selected as the halogen element and the case of using HCl has been shown as a method for introducing it. Besides HCl, one type or a plurality of types of mixed gas selected from HF, HBr, $Cl_2$, $F_2$, $Br_2$ may be used. Besides them, halogen hydroxide may be used in general.

It is preferable to set the content (volume content) of those gases within the atmosphere to 0.25 to 5% if it is HF, 1 to 15% if it is HBr, 0.25 to 5% if it is $Cl_2$, 0.125 to 2.5% if it is $F_2$ and 0.5 to 10% if it is $Br_2$.

If the concentration is below the above-mentioned range, no significant effect is obtained. Further, if the concentration exceeds the upper limit of the above-mentioned range, the surface of the crystalline silicon film is roughened.

Through this step, the concentration of nickel element may be reduced to less than 1/10 of the maximum from the initial stage. It means that the nickel element may be reduced to 1/10 as compared to the case when no gettering by the halogen element is conducted. This effect may be obtained in the same manner even when another metal element is used.

Because the nickel element is gettered to the oxide film formed in the above-mentioned step, naturally the nickel concentration within the oxide film becomes high as compared to other regions.

Further, it has been observed that the concentration of nickel element is apt to be high near the interface of the crystalline silicon film 105 with the oxide film 106. It is considered to happen because the region where the gettering mainly takes place is on the side of the oxide film near the interface between the silicon film and the oxide film. The gettering proceeding near the interface is considered to be caused by the existence of stress and defects.

Then, the thermal oxide film 106 containing nickel in high concentration is removed. The thermal oxide film 106 may be removed by means of wet etching or dry etching using buffered hydrofluoric acid (or other hydrofluorite etchant).

Figure 1E:
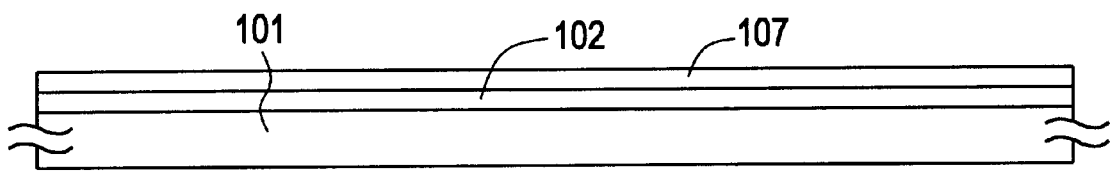

Thus, a crystalline silicon film 107 in which the concentration of nickel has been reduced is obtained as shown in FIG. 1E.

Because nickel element is contained near the surface of the obtained crystalline silicon film 107 in relatively high concentration, it is effective to advance the above-mentioned etching to over-etch, more or less, the surface of the crystalline silicon film 107.

It is also effective to irradiate laser light again after removing the thermal oxide film 106 to promote the crystallinity of the crystalline silicon film 107 thus obtained further. That is, it is effective to irradiate laser light again after gettering the nickel element.

Although the case when the KrF excimer laser (wavelength: 248 nm) is used as the laser to be used has been shown in the present specification, it is possible to use a XeCl excimer laser (wavelength: 308 nm) and other types of excimer lasers.

It is also possible to arrange so as to irradiate ultraviolet rays or infrared rays for example instead of laser light.

SECOND EMBODIMENT

The present embodiment relates to a case when Cu is used as the metal element which promotes the crystallization of silicon in the arrangement shown in the first embodiment. In this case, cupric acetate [$Cu(CH_3 COO)_2$] or cupricchloride ($CuCl_2$ $2H_2O$) may be used as the solution for introducing Cu.

THIRD EMBODIMENT

The present embodiment relates to a case of growing crystal in the form different from that in the first embodiment. That is, the present embodiment relates to a method of growing the crystal in a direction parallel to the substrate, i.e. a method called lateral growth, by utilizing the metal element which promotes crystallization of silicon.

FIG. 2 shows the fabrication process according to the present embodiment. At first, a silicon oxide nitride film is formed as an underlying film 202 in a thickness of 3000 angstrom on the Corning 1737 glass substrate (or a quartz substrate) 201.

Next, an amorphous silicon film 203 which is the starting film for a crystalline silicon film is formed in a thickness of 600 angstrom by low pressure thermal CVD. The thickness of the amorphous silicon film is preferable to be less than 2000 angstrom as described before.

It is noted that plasma CVD may be used instead of the low pressure thermal CVD.

Next, a silicon oxide film not shown is formed in a thickness of 1500 angstrom and is patterned to form a mask 204. An opening is created on the mask in a region 205. The amorphous silicon film 203 is exposed at the region where the opening 205 is created.

The opening 205 has a thin and long rectangular shape in the longitudinal direction from the depth to the front side of the figure. Preferably, the width of the opening 203 is 20 $\mu$m or more. The length thereof in the longitudinal direction may be determined arbitrarily.

Then, the nickel acetate aqueous solution containing 10 ppm of nickel element in terms of weight is applied in the same manner with the first embodiment and the extra solution is removed by performing spin drying by using a spinner not shown.

Figure 2A:
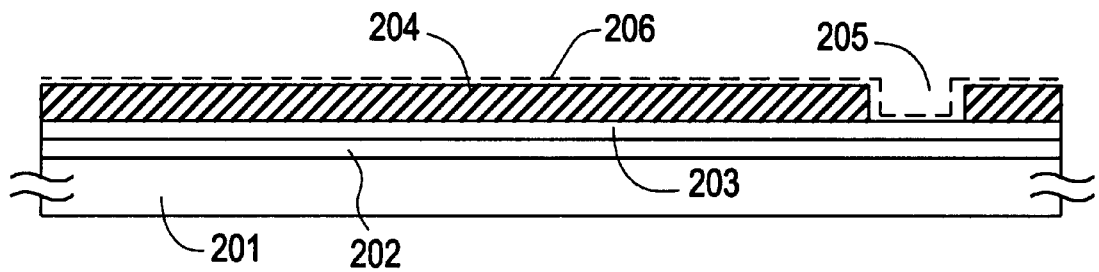
FIGS. 2A–2E shows steps for obtaining a crystalline silicon film.
Figure 2B:
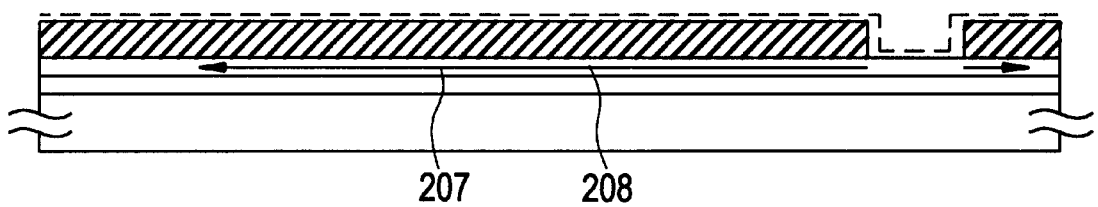

Thus, the solution is held in contact on the exposed surface of the amorphous silicon film 203 as indicated by a dotted line 206 in FIG. 2A.

Next, a heat treatment is performed at 640° C. for four hours in a nitrogen atmosphere containing 3% of hydrogen and in which oxygen is minimized. Then, crystal grows in the direction parallel to the substrate as indicated by the reference numeral 207 in FIG. 2B. This crystal growth advances from the region of the opening 205 to which nickel element has been introduced to the surrounding part. This crystal growth in the direction parallel to the substrate will be referred to as lateral growth.

It is possible to advance this lateral growth across more than 100 $\mu$m under the conditions shown in the present embodiment. Then, a silicon film 208 having a region in which the crystal has thus grown laterally is obtained. It is noted that crystal growth in the vertical direction called vertical growth advances from the surface of the silicon film to the underlying interface in the region where the opening 205 is formed.

Figure 2C:
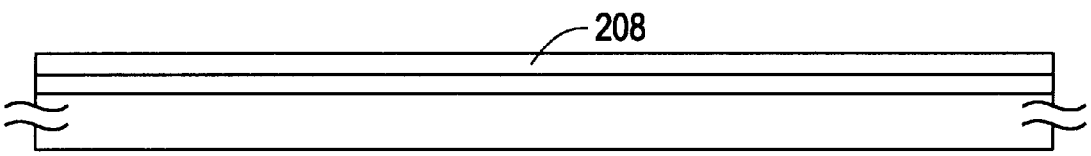

Then, the mask 204 made of the silicon oxide film for selectively introducing nickel element is removed. Thus, the state shown in FIG. 2C is obtained. In this state, the vertical growth region, the lateral growth region and a region in which no crystal has grown (having amorphous state) exist within the silicon film 208.

In this state, the nickel element is unevenly distributed in the film. In particular, the nickel element exists in relatively high concentration at the region where the opening 205 has been formed and at the edge portion 207 of the crystal growth.

After obtaining the state shown in FIG. 2C, laser light is irradiated. The KrF excimer laser is irradiated here similarly to the first embodiment.

The nickel element which has been unevenly distributed is diffused in this step to obtain a condition in which it can be gettered readily in the later gettering step.

Figure 2D:
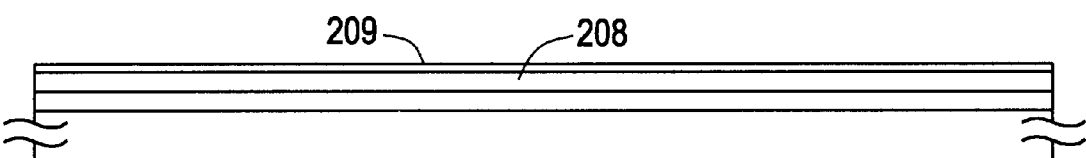

After irradiating the laser light, a heat treatment is performed at 650° C. for 12 hours within an oxygen atmosphere containing 3% of HCl. In this step, an oxide film 209 containing nickel element in high concentration is formed. In the same time, the concentration of nickel element within the silicon film 208 may be reduced relatively (FIG. 2D).

Here, the thermal oxide film 209 is formed in a thickness of 100 angstrom. The thermal oxide film contains the nickel element thus gettered by the action of chlorine in high concentration. Further, because the thermal oxide film 209 is formed, the thickness of the crystalline silicon film 208 is reduced to about 500 angstrom.

Next, the thermal oxide film 209 containing nickel element in high concentration is removed.

In the crystalline silicon film of this state, the nickel element has a distribution of concentration such that it exists in high concentration toward the surface of the crystalline silicon film. This state is caused by the fact that the nickel element has been gettered to the thermal oxide film 209 when the thermal oxide film was formed.

Accordingly, it is useful to etch the surface of the crystalline silicon film to remove the region in which the nickel element exists in high concentration after removing the thermal oxide film 209. That is, the crystalline silicon film in which the nickel element concentration is reduced further may be obtained by etching the surface of the crystalline silicon film in which the nickel element exists in high concentration. However, it is necessary to consider the thickness of the silicon film finally obtained at this time.

Next, patterning is performed to form a pattern 210 formed of the laterally grown region.

The concentration of nickel element which remains within the pattern 210 made of the lateral growth region thus obtained may be reduced further as compared to the case shown in the first embodiment.

This is caused by the fact that the concentration of the metal element contained within the lateral growth region is low originally. Specifically, the concentration of nickel element within the pattern 209 made of the lateral growth region may be readily reduced to the order of $10^{17}$ cm$^{-3}$ or less.

When a thin film transistor is formed by utilizing the lateral growth region, a semiconductor device having a higher mobility may be obtained as compared to the case when the vertical growth region as shown in the first embodiment (crystal grows vertically on the whole surface in the case of the first embodiment) is utilized.

Figure 2E:
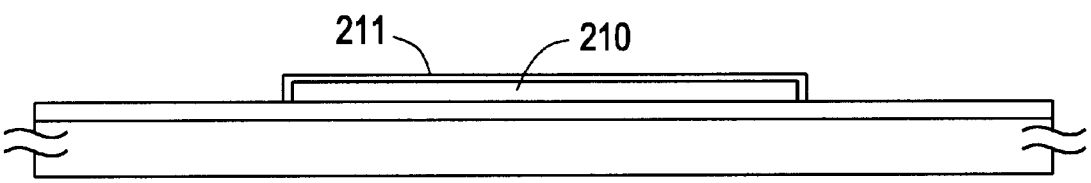

It is noted that it is useful to perform the etching process further after forming the pattern shown in FIG. 2E to remove the nickel element existing on the surface of the pattern.

Then, a thermal oxide film 211 is formed after forming the pattern 210. This thermal oxide film is formed into a thickness of 200 angstrom by performing a heat treatment for 12 hours in an oxygen atmosphere at 650° C.

This thermal oxide film becomes a part of a gate insulating film later when a thin film transistor is constructed.

If the thin film transistor is to be fabricated thereafter, a silicon oxide film is formed further by means of plasma CVD or the like so as to cover the thermal oxide film 211 to form a gate insulating film.

FOURTH EMBODIMENT

The present embodiment relates to a case of fabricating a thin film transistor disposed in a pixel region of an active matrix type liquid crystal display or an active matrix type EL display by utilizing the invention disclosed in the present specification.

FIG. 3 shows the fabrication process according to the present embodiment. At first, the crystalline silicon film is formed on the glass substrate through the process shown in the first or the third embodiment. When the crystalline silicon film is obtained by the arrangement shown in the first embodiment, it is patterned to obtain the state shown in FIG. 3A.

Figure 3A:
FIGS. 3A–3E shows steps for fabricating a thin film transistor.

In the state shown in FIG. 3A, the reference numeral 301 denotes a glass substrate, 302 an underlying film, and 303 an active layer formed of the crystalline silicon film. After obtaining the state shown in FIG. 3A, a plasma treatment is performed within a reduced pressure atmosphere in which oxygen and hydrogen are mixed. The plasma is generated by high-frequency discharge.

Organic substances existing on the surface of the exposed active layer 303 may be removed by the above-mentioned plasma treatment. To be exact, the organic substances adsorbing on the surface of the active layer are oxidized by oxygen plasma and the oxidized organic substances are reduced and vaporized further by hydrogen plasma. Thus the organic substances existing on the surface of the exposed active layer 303 are removed.

The removal of the organic substances is very effective in suppressing fixed charge from existing on the surface of the active layer 303. Because the fixed charge caused by the existence of organic substances hampers the operation of the device and renders the characteristics thereof instable, it is very useful to reduce it.

After removing the organic substances, thermal oxidation is performed within an oxygen atmosphere at 640° C. to form a thermal oxide film 300 of 100 angstrom thick. This thermal oxide film has a high interfacial characteristic with a semiconductor layer and composes a part of a gate insulating film later. Thus, the state shown in FIG. 3A is obtained.

After obtaining the state shown in FIG. 3A, a silicon oxide nitride film 304 which composes the gate insulating film is formed in a thickness of 1000 angstrom. The film may be formed by using plasma CVD using mixed gas of oxygen, sillane and $N_2O$ or plasma CVD using mixed gas of TEOS and $N_2O$.

The silicon oxide nitride film 304 functions as the gate insulating film together with the thermal oxide film 300.

It is also effective to contain halogen element within the silicon oxide nitride film. That is, by fixing the nickel element by the action of the halogen element, it is possible to prevent the function of the gate insulating film as an insulating film from being reduced by the influence of the nickel element (or another metal element which promotes crystallization of silicon) existing within the active layer.

It is significant to use the silicon oxide nitride film in that the metal element hardly infiltrates to the gate insulating film because of its dense film quality. If the metal element infiltrates into the gate insulating film, its function as an insulating film is reduced, thus causing instability and dispersion of characteristics of the thin film transistor.

It is noted that a silicon oxide film which is normally used may be also used for the gate insulating film.

After forming the silicon oxide nitride film 304 which functions as the gate insulating film, an aluminum film not shown which functions as a gate electrode later is formed by sputtering. Scandium is included 0.2 weight % of aluminum within the aluminum film.

Scandium is included in the aluminum film to suppress hillock and whisker from being generated in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Figure 3B:
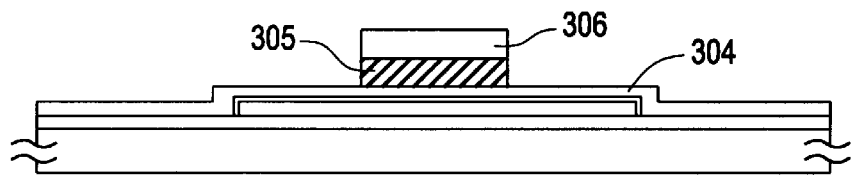
Figure 3C:
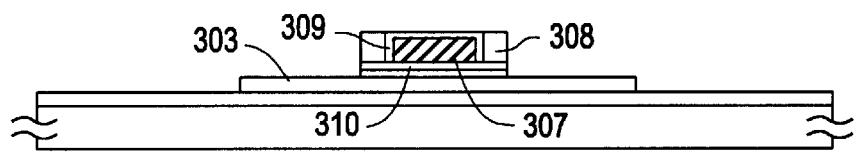

Next, the resist mask 306 is formed and the aluminum film is patterned so as to have a pattern 305. The state shown in FIG. 3B is thus obtained.

Here, another anodization is performed. In this case, 3% of oxalate aqueous solution is used as electrolyte. A porous anodic oxide film 308 is formed by anodizing within this electrolyte by setting the aluminum pattern 305 as the anode.

In this step, the anodic oxide film 308 is formed selectively on the sides of the aluminum pattern because the resist mask 306 having the high adhesiveness exists thereabove.

The anodic oxide film may be grown up to several thick. The thickness is 6000 angstrom here. It is noted that the range of the growth may be controlled by adjusting an anodizing time.

Next, the resist mask 306 is removed. Then, a dense anodic oxide film is formed again. That is, the anodization is performed again by using the ethylene glycol solution containing 3% of tartaric acid as electrolyte. Then, an anodic oxide film 309 having a dense film quality is formed because the electrolyte infiltrates into the porous anodic oxide film 308.

This dense anodic oxide film 309 is 1000 angstrom thick. The thickness is controlled by adjusting applied voltage.

Here, the exposed silicon oxide nitride film 304 and the thermal oxide film 300 are etched by utilizing dry etching.

Then, the porous anodic oxide film 308 is removed by using mixed acid in which acetic acid, nitric acid and phosphoric acid are mixed. Thus, the state shown in FIG. 3D is obtained.

Figure 3D:
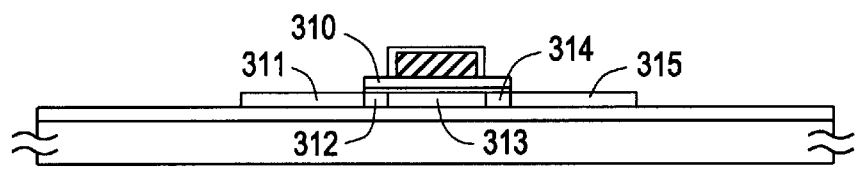

After obtaining the state shown in FIG. 3D, impurity ions are implanted. Here, P (phosphorus) ions are implanted by plasma doping in order to fabricate an N-channel type thin film transistor.

In this step, heavily doped regions 311 and 315 and lightly doped regions 312 and 314 are formed because part of the remaining silicon oxide film 310 functions as a semi-permeable mask, thus blocking part of the implanted ions.

Then, laser light or intense light is irradiated to activate the regions into which the impurity ions have been implanted. Thus, a source region 311, a channel forming region 313, a drain region 315 and low concentration impurity regions 312 and 314 are formed in a manner of self-alignment.

One designated by the reference numeral 314 here is the region called the LDD (lightly doped region) (FIG. 3D).

It is noted that when the dense anodic oxide film 309 is formed as thick as 2000 angstrom or more, offset gate regions may be formed on the outside of the channel forming region 313 by its thickness.

Although the offset gate regions are formed also in the present embodiment, it is not shown in the figures because its size is small, its contribution due to the existence thereof is small and because the figures might otherwise become complicated.

Next, a silicon oxide film or a silicon nitride film or their laminated film is formed as an interlayer insulating film 316. The interlayer insulating film may be constructed by forming a layer made of a resin material on the silicon oxide film or the silicon nitride film.

Figure 3E:
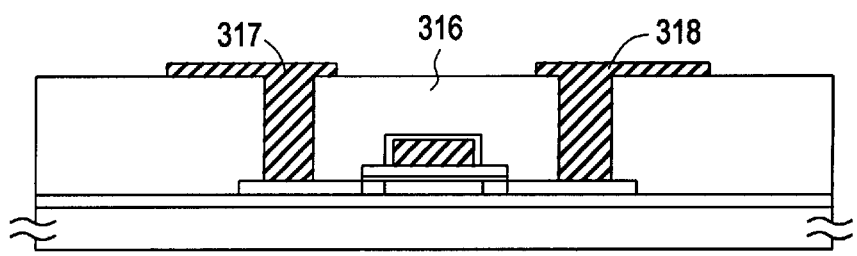

Then, contact holes are created to form a source electrode 317 and a drain electrode 318. Thus, the thin film transistor shown in FIG. 3E is completed.

FIFTH EMBODIMENT

The present embodiment relates to a method for forming the gate insulating film 304 in the arrangement shown in the fourth embodiment. Thermal oxidation may be used as a method for forming the gate insulating film when a quartz substrate or a glass substrate having a high heat resistance is used as the substrate.

The thermal oxidation allows the film quality to be densified and is useful in obtaining a thin film transistor having stable characteristics.

That is, because an oxide film formed by the thermal oxidation is dense as an insulating film and movable electric charge existing therein can be reduced, it is one of the most suitable films as a gate insulating film.

As the method for forming the thermal oxide film, a heat treatment performed in an oxidizing atmosphere at 950° C. may be cited.

At this time, it is effective to mix HCl or the like within the oxidizing atmosphere. Thereby, the metal element existing within the active layer may be fixed in the same time with the formation of the thermal oxide film.

It is also effective to form a thermal oxide film containing nitrogen component by mixing $N_2O$ gas within the oxidizing atmosphere. Here, it is possible to obtain a silicon oxide nitride film by the thermal oxidation by optimizing the mixed ratio of the $N_2O$ gas.

It is noted that the thermal oxide film 300 needs not be always formed in the present embodiment.

SIXTH EMBODIMENT

The present embodiment relates to a case of fabricating a thin film transistor through a process different from that shown in FIG. 3.

FIG. 4 shows the fabrication process according to the present embodiment. At first, the crystalline silicon film is formed on the glass substrate through the process shown in the first or third embodiment. It is then patterned, thus obtaining the state shown in FIG. 4A. After obtaining the state shown in FIG. 4A, a plasma treatment is performed within a reduced pressure atmosphere in which oxygen and hydrogen are mixed.

Figure 4A:
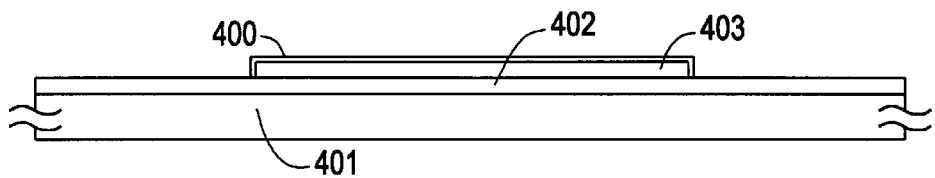
FIGS. 4A–4E shows steps for fabricating a thin film transistor.
Figure 4B:
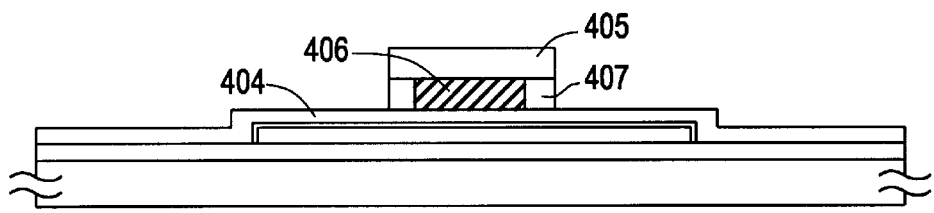
Figure 4C:
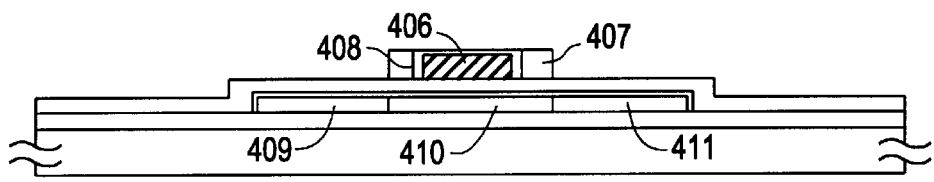

In the state shown in FIG. 4A, the reference numeral 401 denotes a glass substrate, 402 an underlying film, 403 an active layer made of the crystalline silicon film and 400 a thermal oxide film formed again after removing the thermal oxide film for gettering.

After obtaining the state shown in FIG. 4A, a silicon oxide nitride film 404 which composes a gate insulating film is formed in a thickness of 1000 angstrom. The film may be formed by using plasma CVD using mixed gas of oxygen, sillane and $N_2O$ or plasma CVD using mixed gas of TEOS and $N_2O$.

The silicon oxide nitride film 404 composes the gate insulating film together with the thermal oxide film 400. It is noted that a silicon oxide film may be used besides the silicon oxide nitride film.

After forming the silicon oxide nitride film 404 which functions as the gate insulating film, an aluminum film (not shown) which functions as a gate electrode later is formed by sputtering. Scandium is included within the aluminum film at 0.2 weight %.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is about 100 angstrom. This anodic oxide film plays a role of enhancing the adhesiveness with a resist mask to be formed later.

It is noted that the thickness of the anodic oxide film may be controlled by adjusting voltage applied during the anodization.

Next, the resist mask 405 is formed and the aluminum film is patterned so as to have a pattern 406.

Here, another anodization is performed. In this case, 3% of oxalate aqueous solution is used as electrolyte. A porous anodic oxide film 407 is formed by anodizing within this electrolyte by setting the aluminum pattern 406 as the anode.

In this step, the anodic oxide film 407 is formed selectively on the sides of the aluminum pattern because the resist mask 405 having the high adhesiveness exists thereabove.

The anodic oxide film may be grown up to several Am thick. The thickness is 6000 angstrom here. It is noted that the range of the growth may be controlled by adjusting an anodizing time.

Then, the resist mask 405 is removed and another dense anodic oxide film is formed. That is, the anodization is performed again by using the ethylene glycol solution containing 3% of tartaric acid as electrolyte. Then, an anodic oxide film 408 having a dense film quality is formed because the electrolyte infiltrates into the porous anodic oxide film 407 (FIG. 2C).

Here, the initial implantation of impurity ions is performed. This step may be performed after removing the resist mask 405.

A source region 409 and a drain region 411 are formed by implanting the impurity ions. No impurity ion is implanted to a region 410.

Then, the porous anodic oxide film 407 is removed by using mixed acid in which acetic acid, nitric acid and phosphoric acid are mixed. Thus, the state shown in FIG. 4D is obtained.

Figure 4D:
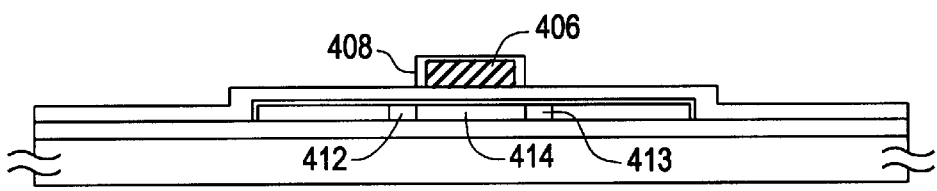

After obtaining the state shown in FIG. 4D, impurity ions are implanted again. The impurity ions are implanted under the doping condition lighter than that of the first implantation.

In this step, lightly doped regions 412 and 413 are formed and a region 414 turns out to be a channel forming region (FIG. 4D).

Then, laser light or intense light is irradiated to activate the regions into which the impurity ions have been implanted. Thus, the source region 409, the channel forming region 414, the drain region 411 and low concentration impurity regions 412 and 413 are formed in a manner of self-alignment.

Here, one designated by the reference numeral 413 is the region called the LDD (lightly doped region) (FIG. 4D).

Next, a silicon oxide film or a silicon nitride film or their laminated film is formed as an interlayer insulating film 414. The interlayer insulating film may be constructed by forming a layer made from a resin material on the silicon oxide film or the silicon nitride film.

Figure 4E:
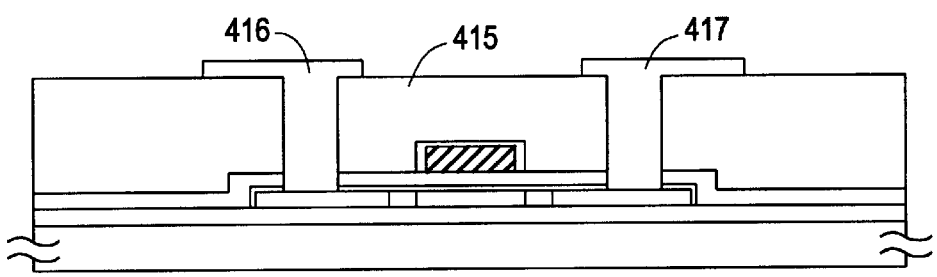

After that, contact holes are created to form a source electrode 416 and a drain electrode 417. Thus, the thin film transistor shown in FIG. 4E is completed.

SEVENTH EMBODIMENT

The present embodiment relates to a case when an N-channel type thin film transistor and a P-channel type thin film transistor are formed in a complementary manner.

The arrangement shown in the present embodiment may be utilized for various thin film integrated circuits integrated on an insulated surface as well as for peripheral driving circuits of an active matrix type liquid crystal display for example.

Figure 5A:
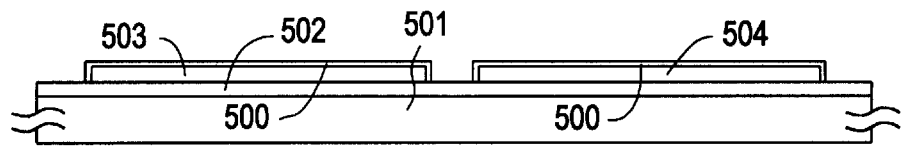
FIGS. 5A–5F shows steps for fabricating a thin film transistor.

At first, a silicon oxide film or a silicon oxide nitride film is formed as an underlying film 502 on a glass substrate 501 as shown in FIG. 5A. It is preferable to use the silicon oxide nitride film.

Next, an amorphous silicon film not shown is formed by plasma CVD or low pressure thermal CVD. Then, the amorphous silicon film is transformed into a crystalline silicon film by the same method as shown in the first embodiment.

Next, a plasma treatment is performed within an atmosphere in which oxygen and hydrogen are mixed. Then, the obtained crystalline silicon film is patterned to obtain active layers 503 and 504. Thus, the state shown in FIG. 5A is obtained.

It is noted that a heat treatment of ten hours at 650° C. is performed within a nitrogen atmosphere containing 3% of HCl in the state shown in FIG. 5A in order to suppress the influence of carriers moving the side of the active layer.

Because an OFF current characteristic is degraded if a trap level exists on the side of the active layer due to the existence of the metal element, it is useful, by performing the process shown here, to reduce the density of the level on the side of the active layer.

Further, the thermal oxide film 500 and the silicon oxide nitride film 505 which compose a gate insulating film are formed. If quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Besides the aluminum film, a metal which can be anodized (e.g. tantalum) may be used.

After forming the aluminum film, a very thin and dense anodic oxide film is formed on the surface thereof by the method described before.

Next, a resist mask not shown is provided on the aluminum film to pattern the aluminum film. Then, anodization is performed by setting the obtained aluminum pattern as the anode to form porous anodic oxide films 508 and 509. The thickness of the porous anodic oxide films is 5000 angstrom for example.

Figure 5B:
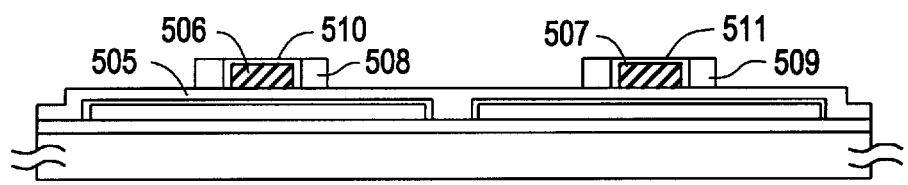

Then, another anodization is performed under the condition of forming dense anodic oxide films to form dense anodic films 510 and 511. The thickness of the dense anodic oxide films 510 and 511 is 800 angstrom. Thus, the state shown in FIG. 5B is obtained.

Figure 5C:
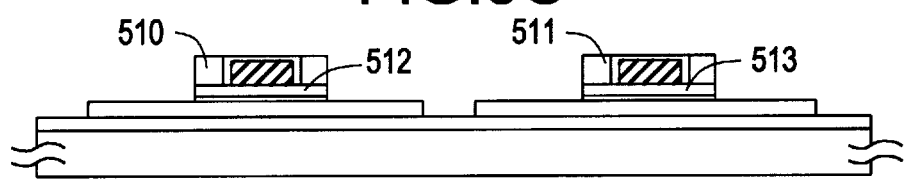

Then, the exposed silicon oxide film 505 and the thermal oxide film 500 are removed by dry etching, thus obtaining the state shown in FIG. 5C.

Figure 5D:
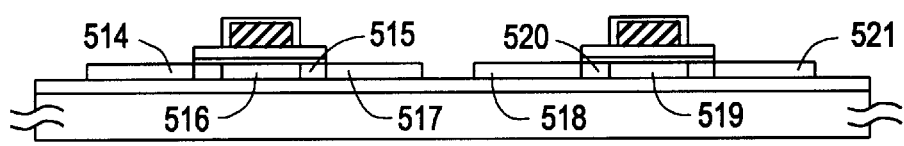

After obtaining the state shown in FIG. 5C, the porous anodic oxide films 508 and 509 are removed by using mixed acid in which acetic acid, nitric acid and phosphoric acid are mixed. Thus, the state shown in FIG. 5D is obtained.

Here, resist masks are disposed alternately to implant P ions to the thin film transistor on the left side and B ions to the thin film transistor on the right side.

By implanting those impurity ions, a source region 514 and a drain region 517 having N-type in high concentration are formed in a manner of self-alignment.

Further, a region 515 to which P ions are doped in low concentration, thus having weak N-type, as well as a channel forming region 516 are formed in the same time.

The reason why the region 515 having the weak N-type is formed is because the remaining gate insulating film 512 exists. That is, part of P ions transmitting through the gate insulating film 512 is blocked by the gate insulating film 512.

By the same principle, a source region 521 and a drain region 518 having strong P-type are formed in a manner of self-alignment and a low concentrate impurity region 520 is formed in the same time. Further, a channel forming region 519 is formed in the same time.

In the case that when the thickness of the dense anodic oxide films 510 and 511 is as thick as 2000 angstrom, an offset gate region may be formed in contact with the channel forming region by that thickness.

Its existence may be ignored in the case of the present embodiment because the dense anodic oxide films 510 and 511 are so thin as less than 1000 angstrom.

Then, laser light or intense light is irradiated to anneal the region into which the impurity ions have been implanted.

Then, a silicon nitride film 522 and a silicon oxide film 523 are formed as interlayer insulating films as shown in FIG. SE. The thickness is 1000 angstrom, respectively. It is noted that the silicon oxide film 523 need not be formed.

Here, the thin film transistor is covered by the silicon nitride film. The reliability of the thin film transistor may be enhanced by arranging as described above because the silicon nitride film is dense and has a favorable interfacial characteristic.

Figure 5E:
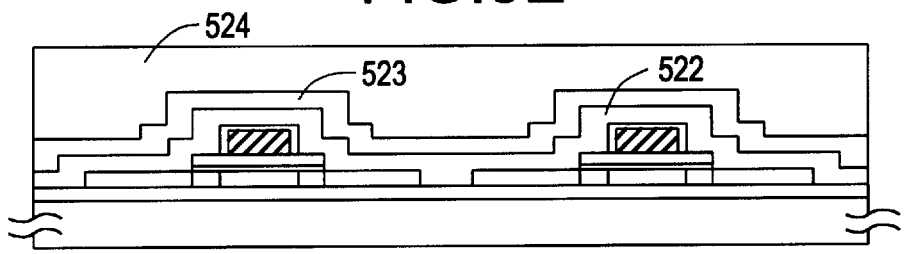
Figure 5F:
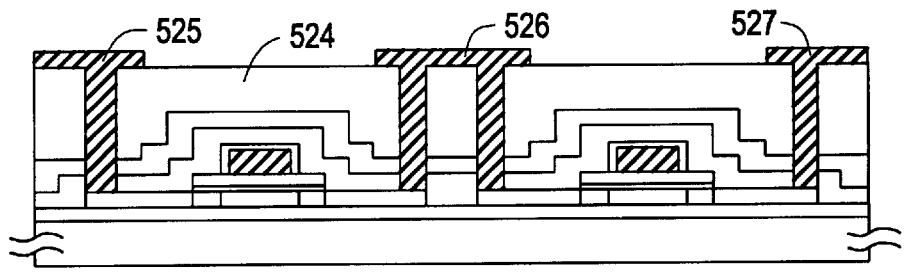

Further, an interlayer insulating film 524 made of a resin material is formed by means of spin coating. Here, the thickness of the interlayer insulating film 524 is 1 μm (FIG. 5E).

Then, contact holes are created to form a source electrode 525 and a drain electrode 526 of the N-channel type thin film transistor on the left side. In the same time, a source electrode 527 and the drain electrode 526 of the thin film transistor on the right side are formed. Here, the electrode 526 is disposed in common.

Thus, the thin film transistor circuit having a CMOS structure constructed in a complementary manner may be formed.

According to the arrangement shown in the present embodiment, the thin film transistor is covered by the nitride film and further the resin material. This arrangement allows to enhance the durability of the thin film transistor to which movable ions nor moisture hardly infiltrate.

Further, it allows to prevent capacitance from being generated between the thin film transistor and wires when a multi-layered wire is formed.

EIGHTH EMBODIMENT

The present embodiment relates to a case when nickel element is introduced directly to the surface of the underlying film in the process shown in the first embodiment. In this case, the nickel element is held in contact with the lower surface of the amorphous silicon film.

In this case, nickel element is introduced after forming the underlying film such that the nickel element (metal element) is held in contact with the surface of the underlying film. Besides the method of using the solution, sputtering, CVD or adsorption may be used as the method for introducing nickel element.

NINTH EMBODIMENT

The present embodiment is characterized in that the crystallinity of an island pattern formed of a crystalline silicon film in the state shown in FIG. 2E, the state shown in FIG. 3A or the state shown in FIG. 4A is improved by irradiating laser light.

A predetermined annealing effect can be obtained with relatively low irradiation energy density by irradiating the laser light in the state shown in FIGS. 2E, 3A and 4A.

It is considered to have been effected because the laser energy is irradiated to a spot of small area, thus enhancing the efficiency of energy utilized in the annealing.

TENTH EMBODIMENT

The present embodiment relates to a case in which patterning of an active layer of a thin film transistor is devised in order to enhance the effect of annealing by the irradiation of laser light.

FIG. 6 shows a process for fabricating the thin film transistor according to the present embodiment. At first, a silicon oxide film or silicon oxide nitride film is formed as an underlying layer on a Corning 1737 glass substrate 601.

Next, an amorphous silicon film not shown is formed in a thickness of 500 angstrom by using low pressure thermal CVD. It is noted that this amorphous silicon film turns out to be a crystalline silicon film 603 through the crystallization process later.

Next, the amorphous silicon film not shown is crystallized by the method shown in the first embodiment (see FIG. 1) or third embodiment (see FIG. 2) to obtain the crystalline silicon film. Thus, the state shown in FIG. 6A is obtained.

Figure 6A:
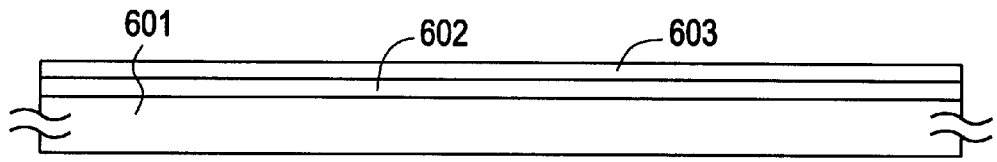
FIGS. 6A–6F shows steps for fabricating an active layer of the thin film transistor.

After obtaining the state shown in FIG. 6A, the crystalline silicon film 603 is formed on the glass substrate in accordance to the process shown in the first embodiment whose fabrication process is shown in FIG. 1 or the third embodiment whose fabrication process is shown in FIG. 2. That is, the amorphous silicon film is crystallized by the heat treatment using nickel element to obtain the crystalline silicon film 604. The heat treatment is performed at 620° C. for four hours.

After obtaining the crystalline silicon film, a pattern for constructing an active layer of a thin film transistor is formed. At this time, the pattern is formed so as to have a sectional profile 604 shown in FIG. 6B.

Figure 6B:
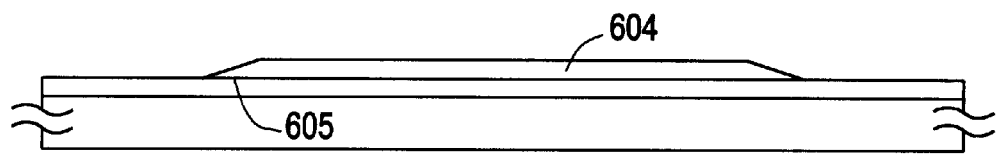

The pattern 604 as shown in FIG. 6B is formed in order to suppress the shape of the pattern from being deformed in the later treatment step of irradiating laser light.

Figure 7A:
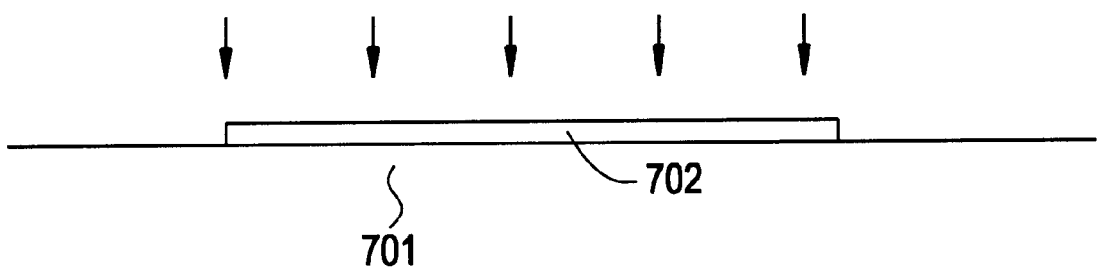
FIGS. 7A–7B shows states when laser light is irradiated to patterns made of the crystalline silicon film.
Figure 7B:
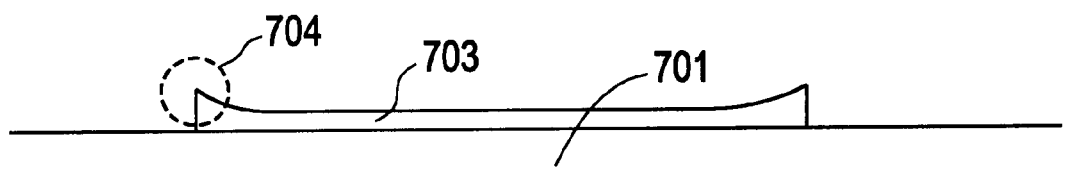

In general, when laser light is irradiated to a pattern 702 made of a normal island-shape silicon film formed on a base 701 as shown in FIG. 7A, a convex portion 704 is formed at the edge of a pattern 703 after the irradiation of the laser light as shown in FIG. 7B.

It is considered to happen because energy of the irradiated laser light is concentrated at the edge of the pattern where heat cannot be released.

This phenomenon may become a factor of defective wires composing a thin film transistor or of defective operation thereof later.

Thus, the pattern 604 of the active layer is formed so as to have the profile as shown in FIG. 6B in the arrangement of the present embodiment.

Such arrangement allows to suppress the pattern of the silicon film from being deformed like the one shown in FIG. 7B when laser light is irradiated.

It is preferable to set an angle of the part designated by the reference numeral 605 from 20° to 50°. It is not preferable to set the angle of 605 below 20° because an area occupied by the active layer increases and it becomes difficult to form it. Further, it is not also preferable to set the angle of 600 above 50° because the effect for suppressing the shape as shown in FIG. 7B from being formed is reduced.

The pattern 604 may be realized by utilizing isotropic dry etching in patterning it and by controlling the conditions of this dry etching.

Figure 6C:
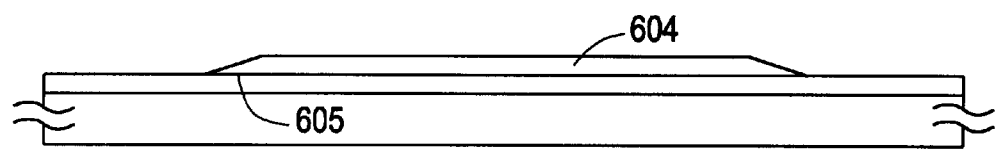

After obtaining the pattern (which turns out to be the active layer later) having the shape 603 in FIG. 6B, laser light is irradiated as shown in FIG. 6C. This step allows to diffuse the nickel element which is locally blocked within the pattern 604 and to promote the crystallization of the pattern.

After finishing to irradiate laser light, a heat treatment is performed within an oxygen atmosphere containing 3% of HCl to form a thermal oxide film 606. Here, the thermal oxide film is formed in 100 angstrom thick by performing the heat treatment for 12 hours in the oxygen atmosphere containing 3% of HCl at 650° C. (FIG. 6D).

The nickel element contained in the pattern 604 is gettered to the thermal oxide film by the action of chlorine. At this time, because the block of the nickel element has been destroyed through the irradiation of laser light in the previous step, the gettering of the nickel element is effectively performed.

Further, the gettering is performed also from the side surfaces of the pattern 604 when the arrangement shown in the present embodiment is adopted. This is useful in enhancing the OFF current characteristics and the reliability of the thin film transistor finally completed. It is because the existence of nickel element which promotes crystallization of silicon and which exists in the side of the active layer relates a wide influence over the increase of OFF current and the instability of the characteristics.

Figure 6D:
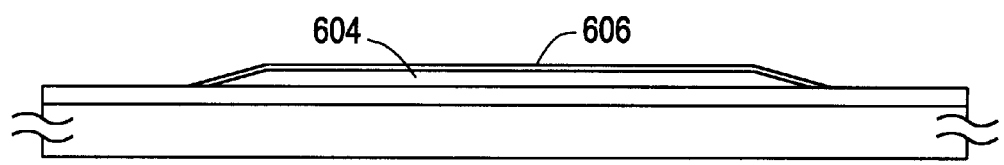
Figure 6E:
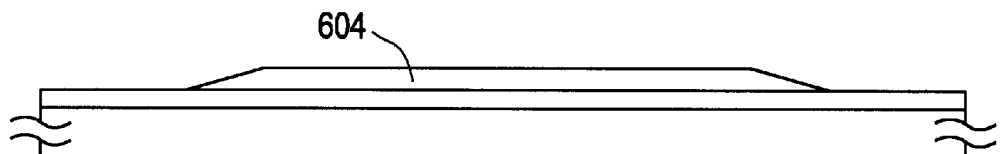
Figure 6F:
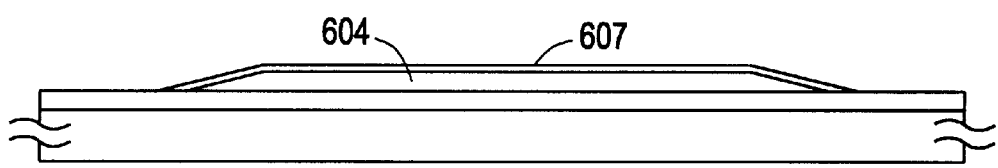

After forming the thermal oxide film 606 for gettering as shown in FIG. 6D, the thermal oxide film 606 is removed. Thus, the state shown in FIG. 6E is obtained. It is concerned that the silicon oxide film 602 might be etched in the step of removing the thermal oxide film 606 when the silicon oxide film is adopted as the underlying layer 602. However, it does not matter so much when the thickness of the thermal oxide film 606 is as thin as 100 angstrom as shown in the present embodiment.

After obtaining the state shown in FIG. 6E, a new thermal oxide film 607 is formed by a heat treatment in an atmosphere of 100% oxygen.

Here, the thermal oxide film 607 is formed in a thickness of 100 angstrom by the heat treatment in the oxygen atmosphere at 650° C.

The thermal oxide film 607 is effective in suppressing the surface of the pattern 603 from being roughened when the laser light is irradiated later. The thermal oxide film also forms a part of a gate insulating film later. Because the thermal oxide film has a very favorable interfacial characteristic with the crystalline silicon film, it is useful to utilize it as part of the gate insulating film.

The laser light may be irradiated again after forming the thermal oxide film 607. Thus, the crystalline silicon film 604 in which the concentration of nickel element has been reduced and which has a high crystallinity may be obtained.

Thereafter, the thin film transistor is fabricated by performing through the process shown in FIG. 3 or 4.

ELEVENTH EMBODIMENT

The present embodiment relates to a case devised in applying a heat treatment at a temperature more than a distortion point of a glass substrate. It is preferable to perform the process for gettering the metal element which promotes crystallization of silicon in the present invention disclosed in the present specification at a high temperature as much as possible.

When the Corning 1737 glass substrate (distortion point: 667° C.) is used for instance, the higher gettering effect can be obtained when the temperature in gettering nickel element by forming the thermal oxide film is 700° C. rather than when it is 650° C.

However, if the heating temperature for forming the thermal oxide film is set at 700° C. using the Corning 1737 glass substrate, the glass substrate deforms as a result.

The present embodiment provides means for solving this problem. That is, according to the arrangement shown in the present embodiment, the glass substrate is placed on a lapping plate which is formed of quartz whose flatness is guaranteed and the heat treatment is performed in this state.

Thereby, the flatness of the softened glass substrate is maintained by the flatness of the lapping plate. It is noted that it is also important to perform cooling in the state in which the glass substrate is placed on the lapping plate.

The adoption of such arrangement allows the heat treatment to be performed even if it is at the temperature above the distortion point of the glass substrate.

What is claimed is:

1. A method for fabricating a semiconductor device, comprising steps of:

providing a semiconductor film comprising amorphous silicon with a metal containing material which promotes crystallization of silicon and crystallizing said semiconductor film by a first heat treatment at a first temperature to obtain a crystalline semiconductor film;

irradiating laser light or intense light to said crystalline semiconductor film;

removing or reducing said metal existing within said crystalline semiconductor film by performing a second heat treatment at a second temperature within an oxidizing atmosphere containing a halogen element after the irradiating step;

removing a thermal oxide film formed in the second heat treatment; and forming another thermal oxide film on the surface of a region from which said thermal oxide film has been removed by performing another thermal oxidation, wherein said second temperature is higher than said first temperature.

2. A method for fabricating a semiconductor device, comprising steps of:

disposing a metal containing material in contact with a semiconductor film comprising amorphous silicon for promoting crystallization;

crystallizing said semiconductor film by a first heat treatment at a first temperature to obtain a crystalline semiconductor film;

irradiating laser light or intense light to said crystalline semiconductor film to diffuse said metal existing in said crystalline semiconductor film within said crystalline semiconductor film;

performing a second heat treatment at a second temperature within an oxidizing atmosphere containing a halogen element to getter said metal existing within said crystalline semiconductor film into a thermal oxide film to be formed after t he irradiating step;

removing said thermal oxide film formed in the second heat treatment; and forming another thermal oxide film on the surface of a region from which said thermal oxide film has been removed by performing another thermal oxidation, wherein said second temperature is higher than said first temperature.

3. A method for fabricating a semiconductor device, comprising steps of:

providing a selected portion of a semiconductor film comprising amorphous silicon with a crystallization promoting material which comprises a metal;

performing a first heat treatment at a first temperature to said semiconductor film to grow crystal in a direction parallel to the film from said selected portion of the semiconductor film;

irradiating laser light or intense light to diffuse said metal existing in a region in which said crystal has grown;

performing a second heat treatment at a second temperature within an oxidizing atmosphere containing a halogen element to form a thermal oxide film, thereby, gettering said metal from the crystallized semiconductor film into said thermal oxide film after the irradiating step;

removing said thermal oxide film; and forming another thermal oxide film on the surface of a region from which said thermal oxide film has been removed by performing another thermal oxidation, wherein said second temperature is higher than said first temperature.

4. A method for fabricating a semiconductor device, comprising steps of:

disposing a metal containing material in contact with a semiconductor film comprising amorphous silicon for promoting crystallization;

crystallizing said amorphous silicon film by a first heat treatment to obtain a crystalline semiconductor film;

patterning said crystalline semiconductor film to form an active layer of said semiconductor device;

irradiating laser light or intense light to said active layer;

removing or reducing said metal existing within said active layer by performing a second heat treatment within an oxidizing atmosphere containing a halogen element after the irradiating step;

removing a thermal oxide film formed in the second heat treatment; and forming another thermal oxide film on the surface of said active layer by performing another thermal oxidation, wherein said second heat treatment is conducted at a higher temperature than said first heat treatment.

5. A method for fabricating a semiconductor device, comprising steps of:

providing a semiconductor film comprising amorphous silicon with a metal containing material for promoting crystallization;

crystallizing said semiconductor film by a first heat treatment to obtain a crystalline semiconductor film;

patterning said crystalline semiconductor film to form an active layer of said semiconductor device;

irradiating laser light or intense light to said active layer;

removing or reducing said metal existing within said active layer by performing a second heat treatment within an oxidizing atmosphere containing a halogen element after the irradiating step;

removing a thermal oxide film formed in the second heat treatment; and forming another thermal oxide film on the surface of said active layer by performing another thermal oxidation wherein said active layer has a tapered shape having an angle made between a side thereof and an underlying surface within a range of 20° to 50°, wherein said second heat treatment is conducted at a higher temperature than said first heat treatment.

6. A method of manufacturing a semiconductor device comprising the steps of:

forming a semiconductor film comprising amorphous silicon on an insulating surface;

crystallizing said semiconductor film;

patterning the crystallized semiconductor film;

treating a surface of the patterned crystallized semiconductor film by an activated mixture gas comprising oxygen an hydrogen to remove an organic substance therefrom;

forming a gate insulating film on said patterned crystallized semiconductor film.

7. A method of manufacturing a semiconductor device comprising the steps of:

forming a semiconductor film comprising amorphous silicon on an insulating surface;

crystallizing said semiconductor film by heating at a first temperature;

irradiating said semiconductor film with a laser light; and oxidizing a surface of said semiconductor film after the crystallization at a second temperature higher than said first temperature after the irradiating step;

wherein the heating at the first temperature is performed in an atmosphere which contains oxygen at a concentration of 1 ppm or less.

8. A method of manufacturing a semiconductor device comprising the steps of:

forming a semiconductor film comprising amorphous silicon over a glass substrate;

crystallizing said semiconductor film by heating at a first temperature;

irradiating said semiconductor film with a laser light; and oxidizing a surface of said semiconductor film after the crystallization at a second temperature higher than a strain point of said glass substrate after the irradiating step;

wherein the heating at the first temperature is performed in an atmosphere which contains oxygen at a concentration of 1 ppm or less.

9. A method for fabricating the semiconductor device according to any one of claims 1 through 3, characterized in that said second treatment is performed in a temperature above 600° C. and below 750° C.

10. A method for fabricating the semiconductor device according to any one of claims 1 through 3, characterized in that a gate insulating film is formed by utilizing said other thermal oxide film.

11. A method for fabricating the semiconductor device according to any one of claims 1 through 3, said metal is one or a plurality elements selected from Fe, Co, Ni, Ru, Rh, Pd, Os, Ir, Pt, Cu and Au.

12. A method for fabricating the semiconductor device according to any one of claims 1 through 3, wherein said oxidizing atmosphere contains a halogen gas selected from HCl, HF, HBr, $Cl_2$, $F_2$ and $Br_2$.

13. A method for fabricating the semiconductor device according to any one of claims 1 through 3, characterized in that said oxidizing atmosphere comprises $O_2$ added with a gas selected from the group consisting of HCl, HF, HBr, $Cl_2$, $F_2$ and $Br_2$.

14. A method for fabricating the semiconductor device according to any one of claims 1 through 3, wherein said oxidizing atmosphere comprises oxygen added with a gas of a hydride of a halogen.

15. A method for fabricating the semiconductor device according to any one of claims 1 through 3, characterized in that further annealing is carried out in a plasma atmosphere containing oxygen and hydrogen after removing said thermal oxide film.

16. A method for fabricating the semiconductor device according to any one of claims 1 through 3, characterized in that a concentration of said oxygen contained in said semiconductor film comprising amorphous silicon is $5 \times 10^{17}$ $cm^{-3}$ to $2 \times 10^{19}$ $cm^{-3}$.

17. A method according to claim 1, 2, 3, 4 or 5 wherein said first heat treatment is conducted in an atmosphere which contains oxygen at a concentration of 1 ppm or less.

18. A method according to claim 1 wherein said semiconductor device is an active matrix type liquid crystal display device or an active matrix type EL display device.

19. A method according to claim 2 wherein said semiconductor device is an active matrix type liquid crystal display device or an active matrix type EL display device.

20. A method according to claim 3 wherein said semiconductor device is an active matrix type liquid crystal display device or an active matrix type EL display device.

21. A method according to claim 4 wherein said semiconductor device is an active matrix type liquid crystal display device or an active matrix type EL display device.

22. A method for fabricating the semiconductor device according to claim 4 or 5, characterized in that a gate insulating film is formed by utilizing said other thermal oxide film.

23. A method for fabricating the semiconductor device according to claim 4 or 5, characterized in that an upper limit of the temperature of said first and second heat treatments is 750° C. or less.

24. A method for fabricating the semiconductor device according to claim 4 or 5, characterized in that said metal is one or a plurality elements selected from Fe, Co, Ni, Ru, Rh, Pd, Os, Ir, Pt, Cu and Au.

25. A method for fabricating the semiconductor device according to claim 4 or 5, wherein said oxidizing atmosphere contains a halogen gas selected from HCl, HF, HBr, $Cl_2$, $F_2$ and $Br_2$.

26. A method for fabricating the semiconductor device according to claim 4 or 5, characterized in that said oxidizing atmosphere comprises $O_2$ added with a gas selected from the group consisting of HCl, HF, HBr, $Cl_2$, $F_2$ and $Br_2$.

27. A method for fabricating the semiconductor device according to claim 4 or 5, wherein said oxidizing atmosphere comprises oxygen added with a gas of a hydride of a halogen.

28. A method for fabricating the semiconductor device according to claim 4 or 5, characterized in that the temperature of the second heat treatment is higher than that of the first heat treatment.

29. A method for fabricating the semiconductor device according to claim 4 or 5, further comprising a step of treating a surface of the crystallized silicon film by an activated mixture gas of oxygen and hydrogen after removing said thermal oxide film.

30. A method for fabricating the semiconductor device according to claim 4 or 5, characterized in that the concentration of oxygen contained in said semiconductor film comprising amorphous silicon is $5 \times 10^{17}$ $cm^{-3}$ to $2 \times 10^{19}$ $cm^{-3}$.

31. A method according to claim 7 wherein said semiconductor device is an active matrix type liquid crystal display device or an active matrix type EL display device.

32. A method according to claim 5 wherein said semiconductor device is an active matrix type liquid crystal display device or an active matrix type EL display device.

33. A method according to claim 6 wherein said semiconductor device is an active matrix type liquid crystal display device or an active matrix type EL display device.

34. A method according to claim 6 further comprising a step of irradiating said semiconductor film with a laser light after said crystallizing.

35. A method according to claim 6 wherein said crystallizing of the semiconductor film is conducted in an atmosphere which contains oxygen at a concentration of 1 ppm or less.

36. A method according to claim 6 wherein said crystallizing is performed by a thermal treatment.

37. A method according to claim 6, 7 or 8 further comprising a step of disposing a crystallization promoting material in contact with said semiconductor film comprising amorphous silicon for promoting crystallization thereof.

38. A method according to claim 8 wherein said semiconductor device is an active matrix type liquid crystal display device or an active matrix type EL display device.

* * * * *